(12) United States Patent
Vu et al.

(10) Patent No.: US 8,864,373 B2
(45) Date of Patent: Oct. 21, 2014

(54) SMALL HIGHLY ACCURATE BATTERY TEMPERATURE MONITORING CIRCUIT

(75) Inventors: Luan Minh Vu, San Jose, CA (US); Thomas Y. Tse, Santa Clara, CA (US); Tuong Hoang, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 417 days.

(21) Appl. No.: 13/230,182

(22) Filed: Sep. 12, 2011

(65) Prior Publication Data

US 2013/0063182 A1 Mar. 14, 2013

(51) Int. Cl.
*H01M 10/48* (2006.01)

(52) U.S. Cl.
CPC .............. *H01M 10/486* (2013.01); *Y02E 60/12* (2013.01)
USPC .................. 374/152; 374/142; 374/1; 702/99; 702/63; 324/433; 324/500; 320/153

(58) Field of Classification Search
CPC .............. G01R 31/3658; G01R 31/362; G01R 19/16542; G01R 31/3675; G01R 31/3637
USPC .................. 324/426, 433, 500; 320/153, 156; 702/117, 99, 130; 374/1, 141, 142, 374/152, 170–173, 185, 183
See application file for complete search history.

(56) References Cited

U.S. PATENT DOCUMENTS

| | | | | |
|---|---|---|---|---|
| 3,587,078 A | * | 6/1971 | Eichmann et al. | 340/518 |
| 4,994,792 A | * | 2/1991 | Ziegler, Jr. | 340/584 |
| 5,200,736 A | * | 4/1993 | Coombs et al. | 340/586 |
| 5,426,428 A | * | 6/1995 | Binder et al. | 340/870.17 |
| 5,804,944 A | * | 9/1998 | Alberkrack et al. | 320/163 |
| 6,791,464 B2 | * | 9/2004 | Huang | 340/636.15 |
| 7,154,421 B2 | | 12/2006 | Devendorf et al. | |
| 7,157,883 B2 | | 1/2007 | Johnson et al. | |
| 7,589,499 B2 | | 9/2009 | Denning et al. | |
| 2003/0038637 A1 | * | 2/2003 | Bertness et al. | 324/426 |
| 2006/0170580 A1 | | 8/2006 | Lauritzen et al. | |
| 2011/0115442 A1 | * | 5/2011 | Garrastacho et al. | 320/157 |
| 2012/0286734 A1 | * | 11/2012 | Miyazaki et al. | 320/118 |
| 2013/0160522 A1 | * | 6/2013 | Kromrey | 73/29.01 |
| 2013/0187659 A1 | * | 7/2013 | Kubo et al. | 324/433 |
| 2014/0088823 A1 | * | 3/2014 | Kubo et al. | 701/34.4 |

* cited by examiner

*Primary Examiner* — Gail Verbitsky
(74) *Attorney, Agent, or Firm* — Andrew Viger; Frederick J. Telecky, Jr.

(57) ABSTRACT

A battery temperature monitoring circuit, which has a cold comparator and a hot comparator, achieves high accuracy in a small cell size by utilizing a cold current optimized for the cold comparator and a cold reference voltage, and a hot current optimized for the hot comparator and a hot reference voltage, along with switching circuitry that provides the cold current to the cold comparator as the battery temperature approaches the cold trip temperature, and the hot current to the hot comparator as the battery temperature approaches the hot trip temperature.

20 Claims, 3 Drawing Sheets

SMALL HIGHLY ACCURATE BATTERY TEMPERATURE MONITORING CIRCUIT

BACKGROUND OF THE INVENTION

1. Field of the Invention

The present invention relates to a battery temperature monitoring circuit and, more particularly, to a small highly accurate battery temperature monitoring circuit.

2. Description of the Related Art

A battery temperature monitoring circuit is, as the name implies, a circuit that monitors the temperature of a battery. Battery temperature monitoring circuits are commonly used with lithium ion batteries because significant safety issues arise when a lithium ion battery is charged while the temperature of the battery is above or below designated temperature levels.

FIG. 1 shows a schematic diagram that illustrates an example of a prior art battery temperature monitoring circuit 100. As shown in FIG. 1, battery temperature monitoring circuit 100 includes a cold voltage comparator 110 with hysteresis that detects a too cold condition, and a hot voltage comparator 112 with hysteresis that detects a too hot condition.

As further shown in FIG. 1, the cold and hot voltage comparators 110 and 112, which are conventional devices, have a number of inputs that, in the present example, include an upper reference voltage input VR1, a lower reference voltage input VR2, a measured voltage input MM, an enable input EN, and a bias current input BC.

In the present example, the upper reference voltage input VR1 of cold voltage comparator 100 is connected to receive an upper cold reference voltage VC1 that represents a cold trip point temperature, while the lower reference voltage input VR2 of cold comparator 100 is connected to receive a lower cold reference voltage VC2.

Similarly, the upper reference voltage input VR1 of hot comparator 112 is connected to receive an upper hot reference voltage VH1, while the lower reference voltage input VR2 of hot comparator 112 is connected to receive a lower hot reference voltage VH2 that represents a hot trip point temperature.

In addition, the measured inputs MM of both the cold and hot voltage comparators 110 and 112 are connected to receive a measured battery temperature voltage VB, while the enable inputs EN are connected to receive an enable voltage VE. The bias current input BC of cold voltage comparator 110 is connected to receive a bias current BI1, while the bias current input BC of hot voltage comparator 110 is connected to receive a bias current BI2. Further, cold voltage comparator 110 has an output that generates a too cold signal VTC, and hot voltage comparator 112 has an output that generates a too hot signal VTH.

As also shown in FIG. 1, battery temperature monitoring circuit 100 further includes a thermistor 114 that is electrically connected to the measured inputs MM of both the cold and hot voltage comparators 110 and 112, and physically connected to a lithium ion battery 116. In addition, thermistor 114 is thermally connected to lithium ion battery 116 so that the temperature of thermistor 114 is substantially the same as the temperature of lithium ion battery 116.

In the present example, thermistor 114 is implemented as a negative temperature coefficient (NTC) thermistor. An NTC thermistor has a resistance that decreases as the temperature of the NTC thermistor increases, and increases as the temperature of the NTC thermistor decreases. Alternately, thermistor 114 can be implemented as a positive temperature coefficient (PTC) thermistor, which has a resistance that increases as the temperature of the PTC thermistor increases, and decreases as the temperature of the PTC thermistor decreases.

Battery temperature monitoring circuit 100 further includes a current source 120 that sources a zero temperature coefficient (0TC) constant current Ito thermistor 114 to generate the measured battery temperature voltage VB. (A 0TC current is a current that has a constant magnitude over changes in temperature.)

In operation, the cold trip point temperature of lithium ion battery 116 is the temperature where lithium ion battery 116 is too cold to be safely charged, and the hot trip point temperature is the temperature where lithium ion battery 116 is too hot to be safely charged. For example, lithium ion battery 116 may require a cold trip point temperature of 0° C. and a hot trip point temperature of 62° C.

In addition, thermistors typically have a look up table with resistances associated with a range of temperatures. Thus, the upper cold reference voltage VC1 is equal to constant current I multiplied times the resistance of thermistor 114 that is associated with the cold trip point temperature, e.g., 0° C.

Similarly, the lower hot reference voltage VH2 is equal to the constant current I multiplied times the resistance of thermistor 114 that is associated with the hot trip point temperature, e.g., 62° C. The lower cold reference voltage VC2 can be set a predefined voltage below the upper cold reference voltage VC1, while the upper hot reference voltage VH1 can be set a predefined voltage above the lower hot reference voltage VH2. For example, the upper hot reference voltage VH1 can represent a temperature which is 2° C. to 3° C. below the hot trip point temperature.

Further, when the constant current I is input to thermistor 114, the measured battery temperature voltage VB is placed on the measured voltage inputs MM of the cold and hot voltage comparators 110 and 112. Because the constant current I is a 0TC current and the resistance of thermistor 114 varies with temperature, the measured battery temperature voltage VB also varies with temperature, decreasing as the temperature of thermistor 114 increases, and increasing as the temperature of thermistor 114 decreases.

FIG. 2 shows a graph that further illustrates the operation of battery temperature monitoring circuit 100. As shown in FIG. 2, as long as the measured battery temperature voltage VB remains below the upper cold reference voltage VC1 and above the lower hot reference voltage VH2, the temperature of lithium ion battery 116 remains within a safe charging region.

While in the safe charging region, the too cold signal VTC and the too hot signal VTH are both output with safe logic states. For example, the too cold signal VTC can represent a safe charging condition with a logic low, while the too hot signal VTH can represent a safe charging condition with a logic high.

In addition, cold voltage comparator 110 compares the measured battery temperature voltage VB to the upper cold reference voltage VC1 when the too cold signal VTC has the safe logic state, and changes the safe logic state of the too cold signal VTC to an unsafe logic state, such as a logic high, when the measured battery temperature voltage VB exceeds the upper cold reference voltage VC1.

Thus, when the measured battery temperature voltage VB across thermistor 114 rises above the upper cold reference voltage VC1, which indicates that lithium ion battery 116 is too cold to safely charge, cold voltage comparator 110 trips and changes the logic state of the too cold signal VTC. The battery charging circuit responds to the change in logic state of the too cold signal VTC, and stops charging lithium ion battery 116.

In addition to tripping and changing the logic state of the too cold signal VTC when the measured battery temperature voltage VB rises above the upper cold reference voltage VC1, cold voltage comparator 110 also changes reference voltages, switching out the upper cold reference voltage VC1 and switching in the lower cold reference voltage VC2.

Following this, cold voltage comparator 110 compares the measured battery temperature voltage VB to the lower cold reference voltage VC2, and changes the unsafe logic state of the too cold signal VTC back to the safe logic state when the measured battery temperature voltage VB falls below the lower cold reference voltage VC2.

Thus, when the measured battery temperature voltage VB across thermistor 114 falls below the lower cold reference voltage VC2, cold voltage comparator 110 trips and changes the logic state of the too cold signal VTC. The battery charging circuit responds to the change in logic state of the too cold signal VTC, and begins charging lithium ion battery 116 when all of the remaining conditions for charging have been satisfied.

In addition to tripping and changing the logic state of the too cold signal VTC when the measured battery temperature voltage VB falls below the lower cold reference voltage VC2, cold voltage comparator 110 also changes reference voltages, switching out the lower cold reference voltage VC2 and switching back in the upper cold reference voltage VC1.

On the other hand, hot voltage comparator 112 compares the measured battery temperature voltage VB to the lower hot reference voltage VH2 when the too hot signal VTH has the safe logic state, and changes the safe logic state of the too hot signal VTH to an unsafe logic state, such as a logic low, when the measured battery temperature voltage VB falls below the lower hot reference voltage VH2.

Thus, when the measured battery temperature voltage VB across thermistor 114 falls below the lower hot reference voltage VH2, which indicates that lithium ion battery 116 is too hot to safely charge, hot voltage comparator 112 trips and changes the logic state of the too hot signal VTH. The battery charging circuit responds to the change in logic state of the too hot signal VTH, and stops charging lithium ion battery 116.

In addition to tripping and changing the logic state of the too hot signal VTH when the measured battery temperature voltage VB falls below the lower hot reference voltage VH2, hot voltage comparator 112 also changes reference voltages, switching out the lower hot reference voltage VH2 and switching in the upper hot reference voltage VH1.

Following this, hot voltage comparator 112 compares the measured battery temperature voltage VB to the upper hot reference voltage VH1, and changes the unsafe logic state of the too hot signal VTH back to the safe logic state when the measured battery temperature voltage VB rises above the upper hot reference voltage VH1.

Thus, when the measured battery temperature voltage VB across thermistor 114 rises above the upper hot reference voltage VH1, hot voltage comparator 112 trips and changes the logic state of the too hot signal VTH. The battery charging circuit responds to the change in logic state of the too hot signal VTH, and begins charging lithium ion battery 116 when all of the remaining conditions for charging have been satisfied.

In addition to tripping and changing the logic state of the too hot signal VTH when the measured battery temperature voltage VB rises above the upper hot reference voltage VH1, hot voltage comparator 112 also changes reference voltages, switching out the upper hot reference voltage VH1 and switching back in the lower hot reference voltage VH2.

The voltage comparator circuits 110 and 112 utilize the lower cold reference voltage VC2 and the upper hot reference voltage VH1 for hysteresis to prevent the too cold and too hot signals VTC and VTH from toggling between the safe and unsafe logic states (an undesirable condition which can occur when noise on the measured battery temperature voltage VB causes the measured battery temperature voltage VB to bounce around the upper cold reference voltage VC1 or the lower hot reference voltage VH2).

One problem with battery temperature monitoring circuit 100 is that the input offset voltages of the cold and hot voltage comparators 110 and 112, the error or differences between the magnitude of the actual upper cold reference voltage VC1 and the specified magnitude for the upper cold reference voltage VC1, the error or differences between the magnitude of the actual lower hot reference voltage VH2 and the specified magnitude for the lower hot reference voltage VH2, and the error or differences between the magnitude of the actual constant current I and the specified magnitude for the constant current I, which are introduced by random variations in the manufacturing process, limit the accuracy of circuit 100.

The effect of the input offset voltage of a voltage comparator can be compensated for by increasing the size and silicon footprint of the voltage comparator, but the increase in size and silicon footprint is significant. For example, a voltage comparator with a maximum input offset voltage of 0.5 mV can consume approximately three times more silicon surface area than a voltage comparator with a maximum input offset voltage of 1 mV.

The errors in the magnitudes of the upper cold reference voltage VC1 and the lower hot reference voltage VH2 can be compensated for by trimming the cold and hot reference voltages VC1 and VH2, but trimming the cold and hot reference voltages VC1 and VH2 is a non-trivial matter in terms of accuracy and linearity. Further, the error in the magnitude of the constant current I can be compensated for by trimming current source 120 so that the magnitude of constant current I matches the specified magnitude.

Thus, there is a need for a battery temperature monitoring circuit that compensates for all sources of error, including the input offset voltages of the voltage comparators, the errors in the magnitudes of the cold and hot reference voltages VC1 and VH2, and the error in the magnitude of the constant current I, without requiring a substantial increase in the size and silicon footprint of a voltage comparator, or non-trivial approaches to generating the reference voltages.

DETAILED DESCRIPTION OF THE INVENTION

Figure 1:
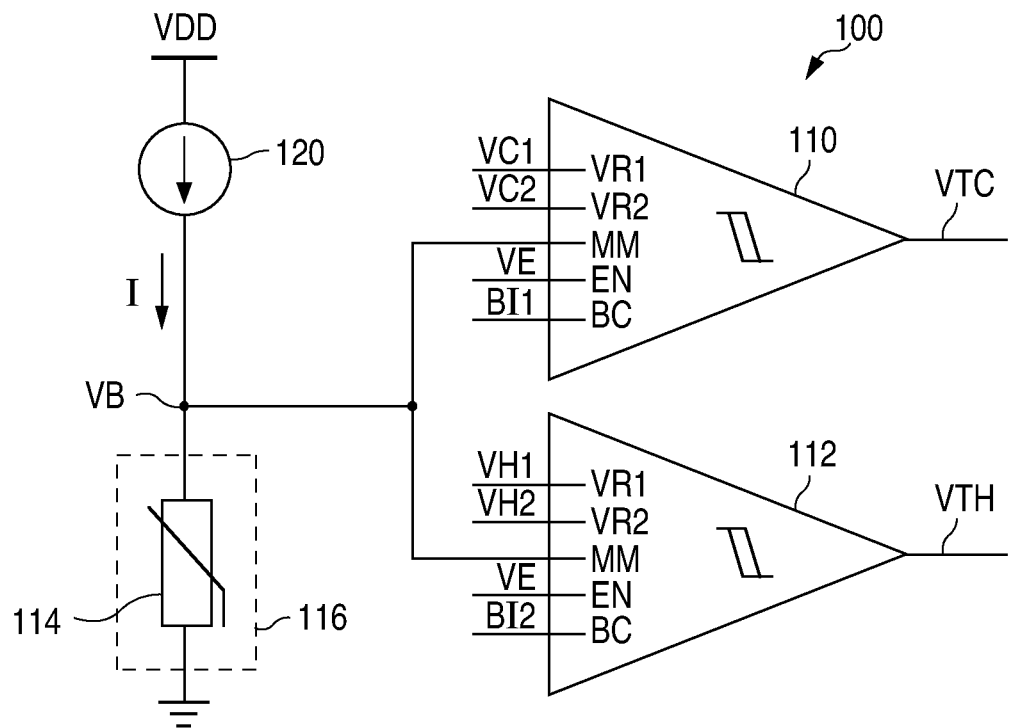
FIG. 1 is a schematic diagram illustrating an example of a prior art battery temperature monitoring circuit 100.
Figure 2:
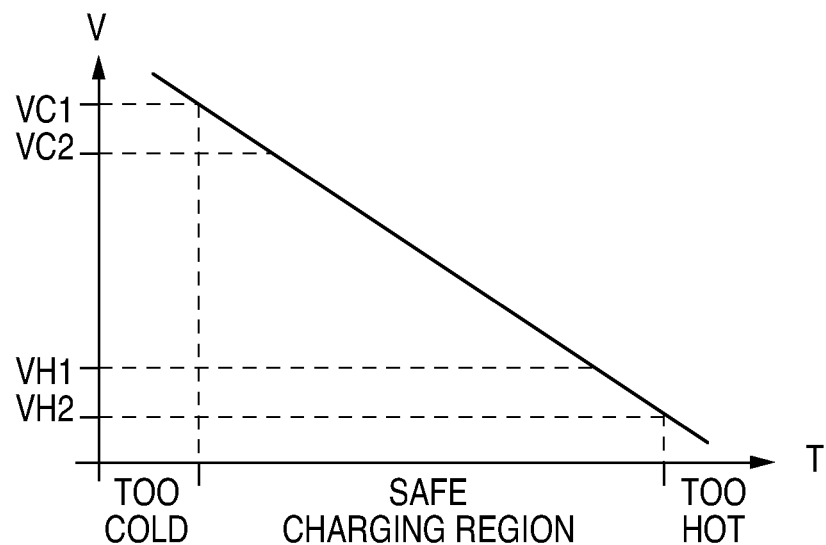
FIG. 2 is a graph further illustrating the operation of battery temperature monitoring circuit 100.
Figure 3:
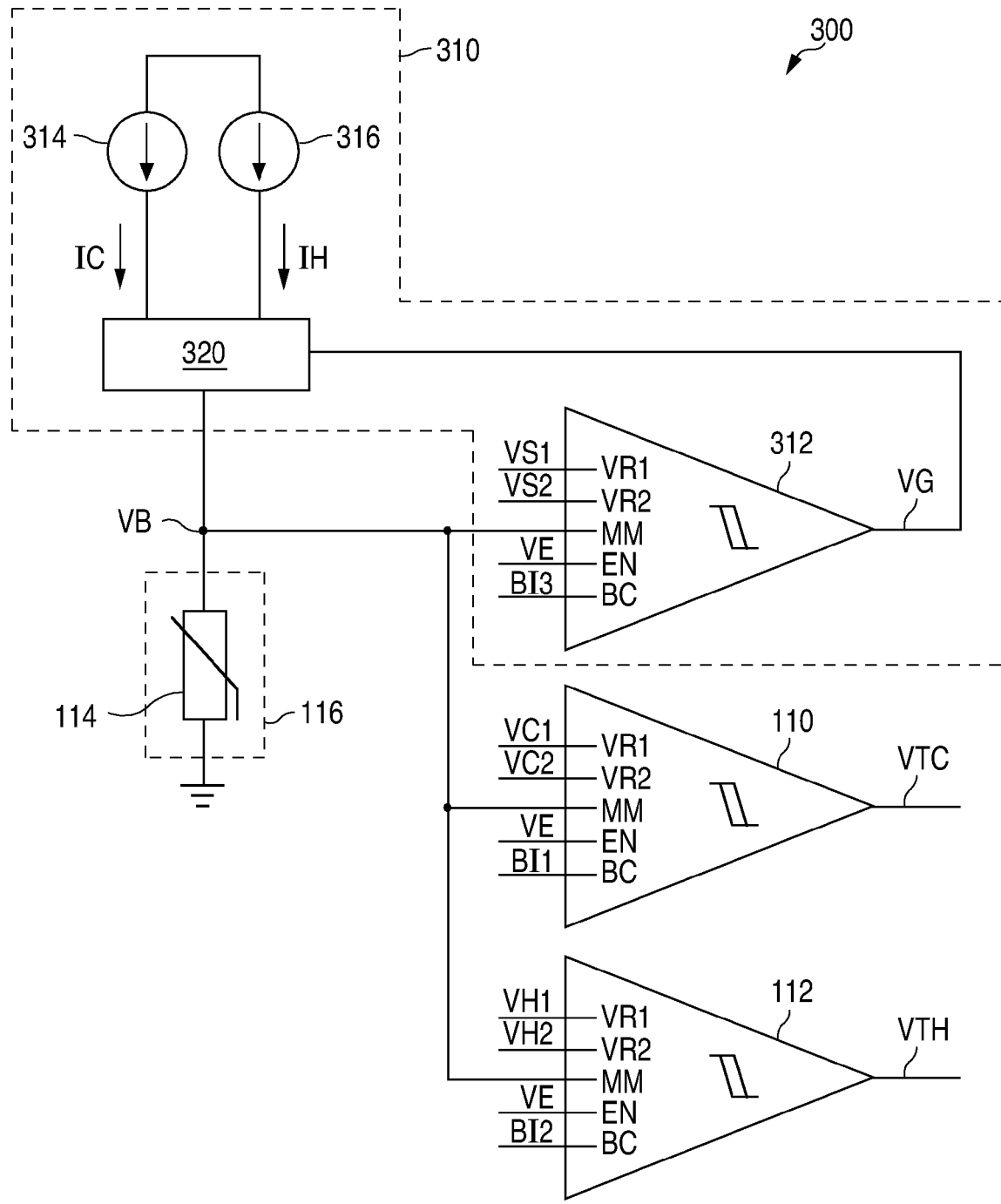
FIG. 3 is a schematic diagram illustrating an example of a battery temperature monitoring circuit 300 in accordance with the present invention.

FIG. 3 shows a schematic diagram that illustrates an example of a battery temperature monitoring circuit 300 in accordance with the present invention. Battery temperature monitoring circuit 300 is similar to battery temperature monitoring circuit 100 and, as a result, utilizes the same reference numerals to designate the elements which are common to both circuits.

As shown in FIG. 3, temperature monitoring circuit 300 differs from temperature monitoring circuit 100 in that temperature monitoring circuit 300 utilizes a current control circuit 310 in lieu of constant current source 120. Current control circuit 310 sources a cold constant current to cold voltage comparator 110 when the measured battery temperature voltage VB approaches the upper cold reference voltage VC1, and a hot constant current to hot voltage comparator 112 when the measured battery temperature voltage VB approaches the lower hot reference voltage VH2.

As further shown in FIG. 3, current control circuit 310 includes a selection voltage comparator 312 with hysteresis that selects either the cold constant current or the hot constant current. Selection voltage comparator 312, which is a conventional device, has a number of inputs that, in the present example, include an upper reference voltage input VR1, a lower reference voltage input VR2, a measured voltage input MM, an enable input EN, and a bias current input BC.

In the present example, the upper reference voltage input VR1 of selection voltage comparator 312 is connected to receive an upper selection reference voltage VS1 that represents a cold temperature which has been selected to indicate that the battery temperature is approaching a too cold to charge condition. In addition, the lower reference voltage input VR2 of selection voltage comparator 312 is connected to receive a lower selection reference voltage VS2 that represents a hot temperature which has been selected to indicate that the battery temperature is approaching a too hot to charge condition.

Further, the measured voltage input MM of selection voltage comparator 312 is connected to receive the measured battery temperature voltage VB, while the enable input EN is connected to receive the enable voltage VE and the bias current input BC is connected to receive a bias current BI3. Further, selection voltage comparator 312 has an output that generates a selection signal VG.

As further shown in FIG. 3, current control circuit 310 also includes a cold current source 314 that generates a zero temperature coefficient (0TC) constant cold current IC, a hot current source 316 that generates a 0TC constant hot current IH, and a switch 320 that passes the constant cold current IC or the constant hot current IH in response to the logic state of the selection signal VG.

In accordance with the present invention, the magnitude of the constant cold current IC is selected to minimize the total error, including compensating for the input offset voltage of cold voltage comparator 110 and the error in the cold reference voltage VC1, when cold voltage comparator 110 is near the too cold to charge condition.

In addition, the magnitude of the constant hot current IH is selected to minimize the total error, including compensating for the input offset voltage of hot voltage comparator 112 and the error in the hot reference voltage VH2, when hot voltage comparator 112 is near the too hot to charge condition.

In operation, the upper selection reference voltage VS1 can be set to a predefined voltage below the upper cold reference voltage VC1, while the lower selection reference voltage VS2 can be set to a predefined voltage above the lower hot reference voltage VH2. When the constant cold current IC or the constant hot current IH is input to thermistor 114, the measured battery temperature voltage VB is placed on the measured voltage input MM of selection voltage comparator 312 as well as on the measured voltage inputs MM of the cold and hot voltage comparators 110 and 112.

Because the constant cold current IC and the constant hot current IH are 0TC currents and the resistance of thermistor 114 varies with temperature, the measured battery temperature voltage VB also varies with temperature, decreasing as the temperature of the thermistor 114 increases, and increasing as the temperature of thermistor 114 decreases.

Figure 4:
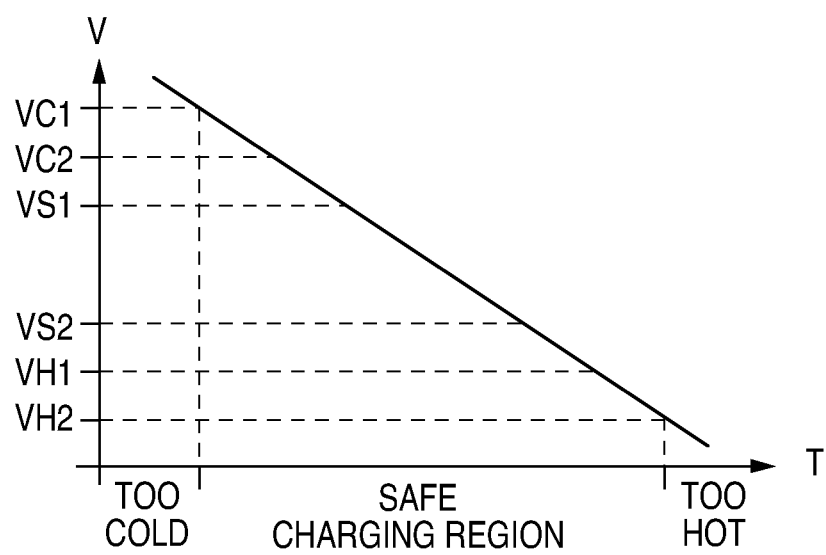
FIG. 4 is a graph illustrating an example of the operation of battery temperature monitoring circuit 300 in accordance with the present invention.

FIG. 4 shows a graph that further illustrates an example of the operation of battery temperature monitoring circuit 300 in accordance with the present invention. As shown in FIG. 4, as long as the measured battery temperature voltage VB remains below the upper selection reference voltage VS1 and above the lower selection reference voltage VS2, either the constant cold current IC or the constant hot current IH can be output by switch 320. The selection signal VG is output with a first logic state, such as a logic low, when the constant hot current IH is output, and a second logic state, such as a logic high, when the constant cold current IC is output.

In addition, selection voltage comparator 312 compares the measured battery temperature voltage VB to the upper selection reference voltage VS1 when the selection signal VG has the first logic state, and changes the first logic state of the selection signal VG to a second logic state, such as a logic high, when the measured battery temperature voltage VB exceeds the upper selection reference voltage VS1.

Thus, when the measured battery temperature voltage VB across thermistor 114 rises above the upper selection reference voltage VS1, which indicates that the measured battery temperature voltage VB is approaching a too cold to charge condition, selection voltage comparator 312 trips and changes the logic state of the selection signal VG.

Switch 320 responds to the change in logic state of the selection signal VG, and begins outputting the constant cold current IC to cold voltage comparator 110 and hot voltage comparator 112. Because the constant cold current IC has a magnitude that minimizes the total error, cold voltage comparator 110 becomes very accurate as the measured battery temperature voltage VB approaches and passes the upper cold reference voltage VC1.

In addition to tripping and changing the logic state of the selection signal VG when the measured battery temperature voltage VB rises above the upper selection reference voltage VS1, selection voltage comparator 312 also changes reference voltages, switching out the upper selection reference voltage VS1 and switching in the lower selection reference voltage VS2. After the measured battery temperature voltage VB rises above the upper cold reference voltage VC1, circuit 300 operates like circuit 100.

After switching reference voltages, selection voltage comparator 312 compares the measured battery temperature voltage VB to the lower selection reference voltage VS2, and changes the second logic state of the selection signal VG back to the first logic state when the measured battery temperature voltage VB falls below the lower selection reference voltage VS2.

Thus, when the measured battery temperature voltage VB across thermistor 114 falls below the lower selection reference voltage VS2, which indicates that the measured battery temperature voltage VB is approaching a too hot to charge condition, selection voltage comparator 312 trips and changes the logic state of the selection signal VG.

Switch 320 responds to the change in logic state of the selection signal VG, and begins outputting the constant hot current IH to cold voltage comparator 110 and hot voltage comparator 112. Because the constant hot current IH has a magnitude that minimizes the total error, hot voltage comparator 112 becomes very accurate as the measured battery temperature voltage VB approaches and passes the lower hot reference voltage VH2.

In addition to tripping and changing the logic state of the selection signal VG when the measured battery temperature voltage VB falls below the lower selection reference voltage VS2, selection voltage comparator 312 also changes reference voltages, switching out the lower selection reference voltage VS2 and switching back in the upper selection reference voltage VS1. After the measured battery temperature voltage VB falls below the lower hot reference voltage VH2, circuit 300 operates like circuit 100.

Selection voltage comparator 312 utilizes the upper and lower selection reference voltages VS1 and VS2 for hysteresis to prevent the selection signal VG from toggling between the first and second logic states (an undesirable condition which can occur when noise on the measured battery temperature voltage VB causes the measured battery temperature voltage VB to bounce around a single selection voltage).

The magnitude of the constant cold current IC can be set by connecting a tester to the measured voltage inputs MM of the cold, hot, and selection voltage comparators 110, 112, and 312 to drive a test battery temperature voltage, and to the output of cold voltage comparator 110 to detect the logic state of the too cold voltage VTC. Following this, the tester sweeps the test battery temperature voltage from below the upper selection reference voltage VS1 to above the upper cold reference voltage VC1, and determines the sweep voltage which causes the too cold voltage VTC to change logic states.

After the sweep voltage which causes the too cold voltage VTC to change logic states has been determined, the resistance of thermistor 114 at the cold trip point temperature is looked up. For example, if the cold trip point temperature is 0° C., then the resistance of thermistor 114 at 0° C. is looked up.

Since the sweep voltage which causes the too cold voltage VTC to change logic states and the resistance of thermistor 114 at the cold trip point temperature are known, the current required to cause the too cold voltage VTC to change logic states at the sweep voltage can be determined by Ohm's law. Following this, trim bits in cold current source 314 are set to adjust the magnitude of the constant cold current IC to match the current magnitude that was calculated with Ohm's law.

The magnitude of the constant hot current IH can be set by connecting the tester to the measured voltage inputs MM of the cold, hot, and selection voltage comparators 110, 112, and 312 to drive the test battery temperature voltage, and to the output of hot voltage comparator 112 to detect the logic state of the too hot voltage VTH. Following this, the tester sweeps the test battery temperature voltage from above the lower selection reference voltage VS2 to below the lower hot reference voltage VH2, and determines the sweep voltage which causes the too hot voltage VTH to change logic states.

After the sweep voltage which causes the too hot voltage VTH to change logic states has been determined, the resistance of thermistor 114 at the hot trip point temperature is looked up. For example, if the hot trip point temperature is 62° C., then the resistance of thermistor 114 at 62° C. is looked up.

Since the sweep voltage which causes the too hot voltage VTH to change logic states and the resistance of thermistor 114 at the hot trip point temperature are known, the current required to cause the too hot voltage VTH to change logic states at the sweep voltage can be determined by Ohm's law. Following this, trim bits in hot current source 316 are set to adjust the magnitude of the constant hot current IH to match the current magnitude that was calculated with Ohm's law.

Thus, the magnitude of the constant cold current IC can be set to minimize the total error, including compensating the input offset voltage of cold comparator 110 and the error in the magnitude of the cold reference voltage VC1. Further, the magnitude of the constant hot current IH can be set to minimize the total error, including compensating the input offset voltage of hot comparator 112 and the error in the magnitude of the hot reference voltage VH2.

As a result, once the magnitudes of the constant cold current IC and the constant hot current IH have been set, the constant cold current IC is output to cold voltage comparator 110 and hot voltage comparator 112 when the measured battery temperature voltage VB exceeds the upper selection reference voltage VS1, and the constant hot current IH is output to cold voltage comparator 110 and hot voltage comparator 112 when the measured battery temperature voltage VB falls below the lower selection reference voltage VS2.

Thus, a small highly accurate battery temperature monitoring circuit has been described. Battery temperature monitoring circuit 300 achieves high accuracy because the cold and hot constant currents IC and IH have been optimized for the cold and hot voltage comparators 110 and 112 and reference voltages VC1 and VH2. Optimizing the currents, in turn, minimizes the total error, which is comprised of errors in the magnitudes of the upper cold reference voltage VC1, the lower hot reference voltage VH2, the cold constant current IC, and the hot constant current IH, as well as the input offset voltages of the cold and hot voltage comparators 110 and 112.

Battery temperature monitoring circuit 300 achieves a small size because a voltage comparator can be formed to have the size of a voltage comparator that has a maximum input offset voltage of 1 mV, while realizing an effective maximum input offset voltage of 0.5 mV by switching between the cold and hot constant currents IC and IH. Further, the addition of a second current source and a switch, such as a multiplexor, require relatively little silicon surface area when compared to the silicon surface area required by a voltage comparator which has an input offset voltage of 0.5 mV.

When an NTC thermistor is utilized (as in the present example), only hot voltage comparator 112 needs to be accurate to, for example, 0.5 mV. Cold voltage comparator 110 can tolerate a higher input offset voltage and reference voltage error. The opposite is true for a PTC thermistor, where only the cold voltage comparator 110 needs to be accurate to, for example, 0.5 mV.

It should be understood that the above descriptions are examples of the present invention, and that various alternatives of the invention described herein may be employed in practicing the invention. For example, the present invention is intended to include voltage comparators, regardless of the specific circuitry that is utilized to realize the voltage comparators. Thus, it is intended that the following claims define the scope of the invention and that structures and methods within the scope of these claims and their equivalents be covered thereby.

What is claimed is:

1. A battery temperature measuring circuit operable with a battery and a temperature sensing device, comprising:
the temperature monitoring device connected to the battery and configured to output a measured voltage representative of battery temperature;
a first comparator circuit that generates a first output signal, the first comparator circuit comparing the measured voltage to a first reference voltage when the first output signal has a safe logic state, and changing the safe logic state of the first output signal to an unsafe logic state when the measured voltage exceeds the first reference voltage;

a second comparator circuit that generates a second output signal, the second comparator circuit comparing the measured voltage to a second reference voltage when the second output signal has a safe logic state, and changing the safe logic state of the second output signal to an unsafe logic state when the measured voltage falls below the second reference voltage; and a current source circuit connected to the temperature sensing device, and the first comparator circuit and the second comparator circuit, the current source circuit sourcing a first constant current to the first comparator circuit when the measured voltage rises above an upper voltage, and a second constant current to the second comparator circuit when the measured voltage falls below a lower voltage, the upper voltage being less than the first reference voltage and greater than the second reference voltage, the lower voltage being less than the upper voltage and greater than the second reference voltage.

2. The battery temperature measuring circuit of claim 1, wherein the temperature monitoring device comprises a thermistor.

3. The battery temperature measuring circuit of claim 1 wherein:

the first comparator circuit has a measured input that receives the measured voltage;

the second comparator circuit has a measured input that receives the measured voltage; and the current source circuit is connected to the measured input of the first comparator circuit and the measured input of the second comparator circuit.

4. The battery temperature measuring circuit of claim 1 wherein the current source circuit includes a third comparator circuit that generates a third output signal, the third comparator circuit:

comparing the measured voltage to the upper voltage and the lower voltage, and generating the third output signal with a first logic state when the measured voltage rises above the upper voltage; and generating the third output signal with a second logic state when the measured voltage falls below the lower voltage;

wherein the current source circuit sources the first constant current in response to the first logic state of the third output signal; and wherein the current source circuit sources the second constant current in response to the second logic state of the third output signal.

5. The battery temperature measuring circuit of claim 1 wherein the current source circuit further includes:

a first constant current source that sources the first constant current;

a second constant current source that sources the second constant current; and a multiplexing circuit connected to the first constant current source, the second constant current source, the first comparator circuit, the second comparator circuit, and the third comparator circuit, the multiplexing circuit passing the first constant current when the third output signal has the second logic state, and the second constant current when the third output signal has the first logic state.

6. The battery temperature measuring circuit of claim 5 wherein the first and second comparator circuits have respective first and second input offset voltages; and wherein the current source circuit further comprises first and second trimming circuitry respectively coupled to the first and second constant current sources, and respectively configured to adjust the first and second constant currents to respective magnitudes that compensate for the respective input offset voltages.

7. The battery temperature measuring circuit of claim 1 wherein the first comparator circuit has an input offset voltage, and the first constant current has a magnitude that compensates for the input offset voltage of the first comparator circuit; and the second comparator circuit has an input offset voltage, and the second constant current has a magnitude that compensates for the input offset voltage of the second comparator circuit.

8. The battery temperature measuring circuit of claim 1 wherein the first comparator circuit compares the measured voltage to a third reference voltage when the first output signal has the unsafe logic state, and changes the unsafe logic state of the first output signal to the safe logic state when the measured voltage falls below the third reference voltage, the third reference voltage being less than the first reference voltage.

9. The battery temperature measuring circuit of claim 8 wherein the second comparator circuit compares the measured voltage to a fourth reference voltage when the second output signal has the unsafe logic state, and changes the unsafe logic state of the second output signal to the safe logic state when the measured voltage rises above the fourth reference voltage, the fourth reference voltage being greater than the second reference voltage.

10. A method of measuring battery temperature employable with a battery and a temperature monitoring device comprising:

generating from the temperature monitoring device a measured voltage representative of battery temperature;

generating, from a first comparator circuit, a first output signal based on comparing the measured voltage to a first reference voltage when the first output signal has a safe logic state, and changing the safe logic state of the first output signal to an unsafe logic state when the measured voltage exceeds the first reference voltage;

generating, from a second comparator circuit, a second output signal based on comparing the measured voltage to a second reference voltage when the second output signal has a safe logic state, and changing the safe logic state of the second output signal to an unsafe logic state when the measured voltage falls below the second reference voltage; and selectively providing to the first and second comparators, respectively first and second constant currents, including sourcing the first constant current to the first comparator circuit when the measured voltage exceeds an upper voltage; and sourcing the second constant current to the second comparator circuit when the measured voltage falls below a lower voltage, the upper voltage being less than the first reference voltage and greater than the second reference voltage, and the lower voltage being less than the upper voltage and greater than the second reference voltage.

11. The method of claim 10 wherein a magnitude of the first constant current compensates for an input offset voltage of the first comparator circuit, and a magnitude of the second constant current compensates for an input offset voltage of the second comparator circuit.

12. The method of claim 10,
wherein the first and second comparator circuits have respective first and second input offset voltages; and
wherein selectively providing to the first and second comparators, respectively first and second constant currents further comprises,
providing a first trimming adjustment to adjust the first constant current to a magnitude that compensates for the first input offset voltage; and
providing a second trimming adjustment to adjust the second constant current to a magnitude that compensates for the second input offset voltage.

13. The method of claim 12 wherein selectively providing to the first and second comparators, respectively first and second constant currents further comprises:
generating, from a third comparator circuit, a third output signal based on comparing the measured voltage to the upper voltage and the lower voltage, including
generating the third output signal with a first logic state when the measured voltage rises above the upper voltage; and
generating the third output signal with a second logic state when the measured voltage falls below the lower voltage;
wherein the first constant current is sourced in response to the first logic state of the third output signal; and
wherein the second constant current is sourced in response to the second logic state of the third output signal.

14. The method of claim 10 wherein the first comparator circuit compares the measured voltage to a third reference voltage when the first output signal has the unsafe logic state, and changes the unsafe logic state of the first output signal to the safe logic state when the measured voltage falls below the third reference voltage, the third reference voltage being less than the first reference voltage.

15. The method of claim 14 wherein the second comparator circuit compares the measured voltage to a fourth reference voltage when the second output signal has the unsafe logic state, and changes the unsafe logic state of the second output signal to the safe logic state when the measured voltage rises above the fourth reference voltage, the fourth reference voltage being greater than the second reference voltage.

16. A battery system including temperature monitoring, comprising:
a temperature monitoring device connected to the battery and configured to output a measured voltage representative of battery temperature;
a battery temperature monitoring circuit, including
a first comparator circuit that generates a first output signal, the first comparator circuit comparing the measured voltage to a first reference voltage when the first output signal has a safe logic state, and changing the safe logic state of the first output signal to an unsafe logic state when the measured voltage exceeds the first reference voltage;
a second comparator circuit that generates a second output signal, the second comparator circuit comparing the measured voltage to a second reference voltage when the second output signal has a safe logic state, and changing the safe logic state of the second output signal to an unsafe logic state when the measured voltage falls below the second reference voltage; and
a current source circuit connected to the temperature sensing device, and the first comparator circuit and the second comparator circuit, the current source circuit sourcing a first constant current to the first comparator circuit when the measured voltage rises above an upper voltage, and a second constant current to the second comparator circuit when the measured voltage falls below a lower voltage, the upper voltage being less than the first reference voltage and greater than the second reference voltage, the lower voltage being less than the upper voltage and greater than the second reference voltage.

17. The battery system of claim 16 wherein the current source circuit includes a third comparator circuit that generates a third output signal, the third comparator circuit:
comparing the measured voltage to the upper voltage and the lower voltage, and
generating the third output signal with a first logic state when the measured voltage rises above the upper voltage; and
generating the third output signal with a second logic state when the measured voltage falls below the lower voltage;
wherein the current source circuit sources the first constant current in response to the first logic state of the third output signal; and
wherein the current source circuit sources the second constant current in response to the second logic state of the third output signal.

18. The battery system of claim 16 wherein the current source circuit further includes:
a first constant current source that sources the first constant current;
a second constant current source that sources the second constant current; and
a multiplexing circuit connected to the first constant current source, the second constant current source, the first comparator circuit, the second comparator circuit, and the third comparator circuit, the switch passing the first constant current when the third output signal has the second logic state, and the second constant current when the third output signal has the first logic state.

19. The battery system of claim 18:
wherein the first and second comparator circuits have respective first and second input offset voltages; and
wherein the current source circuit further comprises first and second trimming circuitry respectively coupled to the first and second constant current sources, and respectively configured to adjust the first and second constant currents to respective magnitudes that compensate for the respective input offset voltages.

20. The battery temperature measuring circuit of claim 16:
wherein the first comparator circuit compares the measured voltage to a third reference voltage when the first output signal has the unsafe logic state, and changes the unsafe logic state of the first output signal to the safe logic state when the measured voltage falls below the third reference voltage, the third reference voltage being less than the first reference voltage; and
wherein the second comparator circuit compares the measured voltage to a fourth reference voltage when the second output signal has the unsafe logic state, and changes the unsafe logic state of the second output signal to the safe logic state when the measured voltage rises above the fourth reference voltage, the fourth reference voltage being greater than the second reference voltage.

* * * * *